United States Patent
Okamoto

(10) Patent No.: US 9,692,415 B2
(45) Date of Patent: Jun. 27, 2017

(54) SEMICONDUCTOR DEVICE HAVING LOW POWER CONSUMPTION

(71) Applicant: SOCIONEXT INC., Yokohama-shi, Kanagawa (JP)

(72) Inventor: Atsushi Okamoto, Hachioji (JP)

(73) Assignee: SOCIONEXT INC., Yokohama (JP)

( * ) Notice: Subject to any disclaimer, the term of this patent is extended or adjusted under 35 U.S.C. 154(b) by 58 days.

(21) Appl. No.: 14/797,885

(22) Filed: Jul. 13, 2015

(65) Prior Publication Data
US 2016/0049936 A1    Feb. 18, 2016

(30) Foreign Application Priority Data
Aug. 13, 2014   (JP) .................. 2014-164786

(51) Int. Cl.
H03K 19/00      (2006.01)
H03K 19/0185    (2006.01)
H03K 17/693     (2006.01)

(52) U.S. Cl.
CPC ....... *H03K 19/0013* (2013.01); *H03K 17/693* (2013.01); *H03K 19/0016* (2013.01); *H03K 19/018521* (2013.01)

(58) Field of Classification Search
None
See application file for complete search history.

(56) References Cited

U.S. PATENT DOCUMENTS

| | | | |
|---|---|---|---|
| 5,942,915 A | 8/1999 | Asada | |
| 6,094,068 A * | 7/2000 | Nomura | H01L 27/092 257/E27.062 |
| 6,469,568 B2 * | 10/2002 | Toyoyama | H03K 19/0016 327/534 |
| 7,202,700 B2 * | 4/2007 | Isono | H03K 19/0016 326/121 |
| 7,723,867 B2 * | 5/2010 | Willingham | H03K 17/164 307/80 |
| 7,851,948 B2 * | 12/2010 | Kawasaki | H04B 3/548 307/130 |
| 8,362,827 B2 * | 1/2013 | Takahashi | G06F 1/3203 326/33 |
| 8,704,410 B2 * | 4/2014 | Nakayama | H03K 19/0016 307/112 |
| 9,059,696 B1 * | 6/2015 | Rahman | H03K 19/0013 |
| 2007/0075743 A1 * | 4/2007 | Oh | H03K 19/0016 326/83 |
| 2008/0296977 A1 | 12/2008 | Kawasaki | |

FOREIGN PATENT DOCUMENTS

| | | |
|---|---|---|
| JP | 9-172367 A | 6/1997 |
| JP | 10-84259 A | 3/1998 |
| JP | 2008-300696 A | 12/2008 |

\* cited by examiner

*Primary Examiner* — Alexander H Taningco
*Assistant Examiner* — Nelson Correa
(74) *Attorney, Agent, or Firm* — Arent Fox LLP

(57) ABSTRACT

A semiconductor device includes a first power supply node and a second power supply node having a voltage value higher than the first power supply node. A first switch interrupts a power supplied from the first power supply node to a first circuit node. A second switch interrupts a power supplied from the second power supply node to a second circuit node. A driver drives the second switch by a third switch being driven. The third switch is connected between the second power supply node and the first circuit node. A controller outputs a control signal to drive the first and third switches.

15 Claims, 10 Drawing Sheets

SEMICONDUCTOR DEVICE HAVING LOW POWER CONSUMPTION

CROSS-REFERENCE TO RELATED APPLICATIONS

This application is based upon and claims the benefit of priority of the prior Japanese Patent Application No. 2014-164786, filed on Aug. 13, 2014, the entire contents of which are incorporated herein by reference.

FIELD

The embodiments discussed herein are directed to a semiconductor device.

BACKGROUND

There is known a technique referred to as a power gating that interrupts a power supplied to a predetermined circuit node in order to reduce a power consumption of a semiconductor device (for example, refer to Japanese Laid-Open Patent Publication No. 2008-300696).

In order to perform the power gating on a power supplied from a plurality of power supplies having different voltage values, a controlling part for controlling the power gating must be provided to each of the power supplies, which results in an increase in a power consumption of semiconductor devices in proportion to the number of controlling parts.

Thus, it is desirous to use a semiconductor device having lower power consumption when performing the power gating on a power supplied from a plurality of power supplies having different voltage values.

SUMMARY

There is provided according to an aspect of the embodiments a semiconductor device, including a first power supply node; a second power supply node having a voltage value higher than the first power supply node; a first switch that interrupts a power supplied from the first power supply node to a first circuit node; a second switch that interrupts a power supplied from the second power supply node to a second circuit node; a driver that drives the second switch by a third switch being driven, the third switch connected between the second power supply node and the first circuit node; and a controller that outputs a control signal to drive the first and third switches.

The object and advantages of the invention will be realized and attained by means of the elements and combinations particularly pointed out in the claims.

It is to be understood that both the foregoing general description and the following detailed description are exemplary and explanatory and not restrictive of the invention.

DESCRIPTION OF EMBODIMENTS

A description will now be given of embodiments with reference to the drawings.

Figure 1:
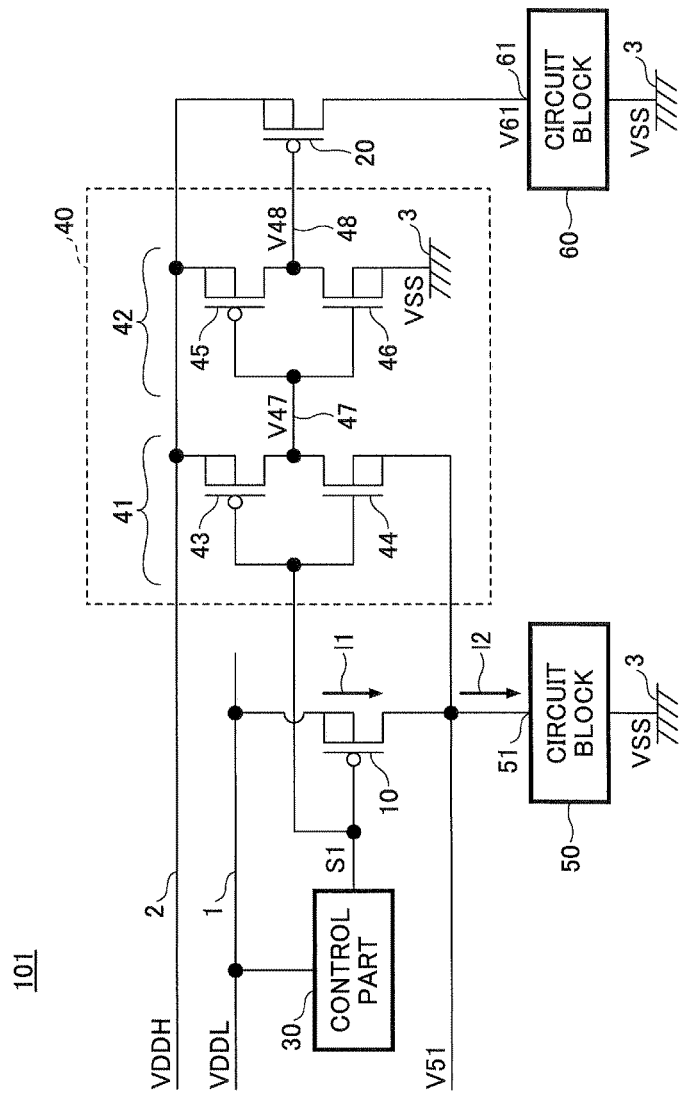
FIG. 1 is a circuit diagram of a semiconductor device according to an embodiment.

FIG. 1 is a circuit diagram of a semiconductor device 101 according to an embodiment. The semiconductor device 101 is, for example, a large-scale integrated circuit (LSI). The semiconductor device 101 includes a power supply node 1, a power supply node 2, a PMOS transistor 10, a PMOS transistor 20, a driver 40, a control part 30 and a ground node 3.

Note that, in this specification, a PMOS transistor refers to a P-channel metal oxide semiconductor (MOS) field effect transistor, and an NMOS transistor refers to an N-channel metal oxide semiconductor (MOS) field effect transistor.

The power supply node 1 is an example of a first power supply node. The power supply node 1 is a first high power supply potential part that is capable of supplying a DC electric power of a power supply voltage VDDL. The power supply voltage VDDL is a potential difference between the power supply node 1 and the ground node 3. The ground node 3 is a ground potential part having a ground voltage VSS.

The power supply node 2 is an example of a second power supply node that has a higher voltage value than the first power supply node. The power supply node 2 is a second high power supply potential part that is capable of supplying a DC electric power of a power supply voltage VDDH, which is higher than the power supply voltage VDDL of the power supply node 1. The power supply voltage VDDH is a potential difference between the power supply node 2 and the ground node 3.

The PMOS transistor 10 is an example of a first switch that interrupts an electric power supplied from the first power supply node to a first circuit node. The PMOS transistor 10 is a semiconductor switching device that is capable of interrupting an electric power supplied from the power supply node 1 to a circuit node 51.

The PMOS transistor 20 is an example of a second switch that interrupts an electric power supplied from the second power supply node to a second circuit node. The PMOS transistor 20 is a semiconductor switching device that is capable of interrupting an electric power supplied from the power supply node 2 to a circuit node 61.

The driver 40 is an example of a driver that drives the second switch by a third switch, which is connected between the second power supply node and the first circuit node, being driven. The driver 40 is, for example, a circuit to turn on/off the PMOS transistor 20 by a CMOS inverter 41, which is connected between the power supply node 2 and the circuit node 51, being driven. The CMOS inverter 41 is an example of the third switch.

Note that CMOS is an abbreviation of the "complementary MOS".

The control part 30 is an example of a control part that outputs a common control signal to drive the first switch and the third switch. The control part 30 is, for example, a circuit that outputs a common control signal S1 to turn on/off the PMOS transistor 10 and the CMOS inverter 41.

Thus, according to the present embodiment, the control to interrupt the power supply from the power supply node 1 to the circuit node 51 and the control to interrupt the power supply from the power supply node 2 to the circuit node 61 are executable by the single common control part 30. That is, even if there are a plurality of systems for which a power supply should be interrupted, the semiconductor device 101 can be a low power consumption type because the number of pieces of the control part 30 can be reduced.

A more specific description is given below of the configuration illustrated in FIG. 1.

The PMOS transistor 10 includes a gate to which the control signal S1 is input, a drain and back gate connected to the power supply node 1 and a drain connected to the circuit node 51. The PMOS transistor 10 turns on/off according to the voltage level of the control signal S1.

The circuit node 51 is a node to which an electric power to be supplied to a predetermined circuit block 50 is input. The circuit block 50 is an arbitrary circuit connected between the circuit node 51 and the ground node 3. The circuit block 50 is constituted by a single element or a plurality of elements.

The driver 40 includes the CMOS inverter 41 to which the control signal S1 is input and a CMOS inverter 42 to which the output of the CMOS inverter 41 is input.

The CMOS inverter 41 includes an NMOS transistor 44 and a PMOS transistor 43 that are connected in series. The NMOS transistor 44 includes a gate to which the control signal S1 is input, a source and back gate connected to the circuit node 51 and a drain connected to an output node 47 of the CMOS inverter 41. The PMOS transistor 43 includes a gate to which the control signal S1 is input, a source and back gate connected to the source node 2 and a drain connected to the output node 47 of the CMOS inverter 41.

The CMOS inverter 42 is an example of a fourth switch that turns on/off the PMOS transistor 20. The CMOS inverter 42 includes an NMOS transistor 46 and a PMOS transistor that are connected in series. The NMOS transistor 46 includes a gate connected to the output node 47, a source and back gate connected to the ground node 3 and a drain connected to an output node 48 of the CMOS inverter 42. The PMOS transistor 45 includes a gate connected to the output node 47, a source and back gate connected to the power supply node 2 and a drain connected to the output node 48 of the CMOS inverter 42.

The PMOS transistor 20 includes a gate connected to the output node 48, a source and back gate connected to the power supply node 2 and a drain connected to a circuit node 61. The output of the CMOS inverter 42, which is provided at the final stage of the driver 40, is input to the gate of the PMOS transistor 20.

The circuit node 61 is a node to which an electric power to be supplied to a predetermined circuit block 60 is input. The circuit block 60 is an arbitrary circuit connected between the power supply node 2 and the ground node 3. The circuit block 60 is constituted by a single element or a plurality of elements. In the example illustrated in FIG. 1, the circuit block 60 is connected between the drain of the PMOS transistor 20 and the ground node 3.

The control part 30 is a power management unit (PMU) to which a power is supplied from the power supply node 1. The control part 30 operates at the power supply voltage VDDL. The control part 30 is connected between the power supply node 1 and the ground node 3.

The control part 30 outputs the control signal S1 having the power supply voltage VDDL as a high level to the gate of the PMOS transistor 10 because the control part 30 does not operate at the power supply VDDH but operates at the power supply voltage VDDL. If the control part 30 operates at the power supply voltage VDDH, the high level of the control signal S1 corresponds to the power supply voltage VDDH. Accordingly, the gate withstand voltage of the PMOS transistor 10 can be decreased lower than the power supply voltage VDDH according to the control part 30 being operated at the power supply voltage VDDL.

Figure 2:
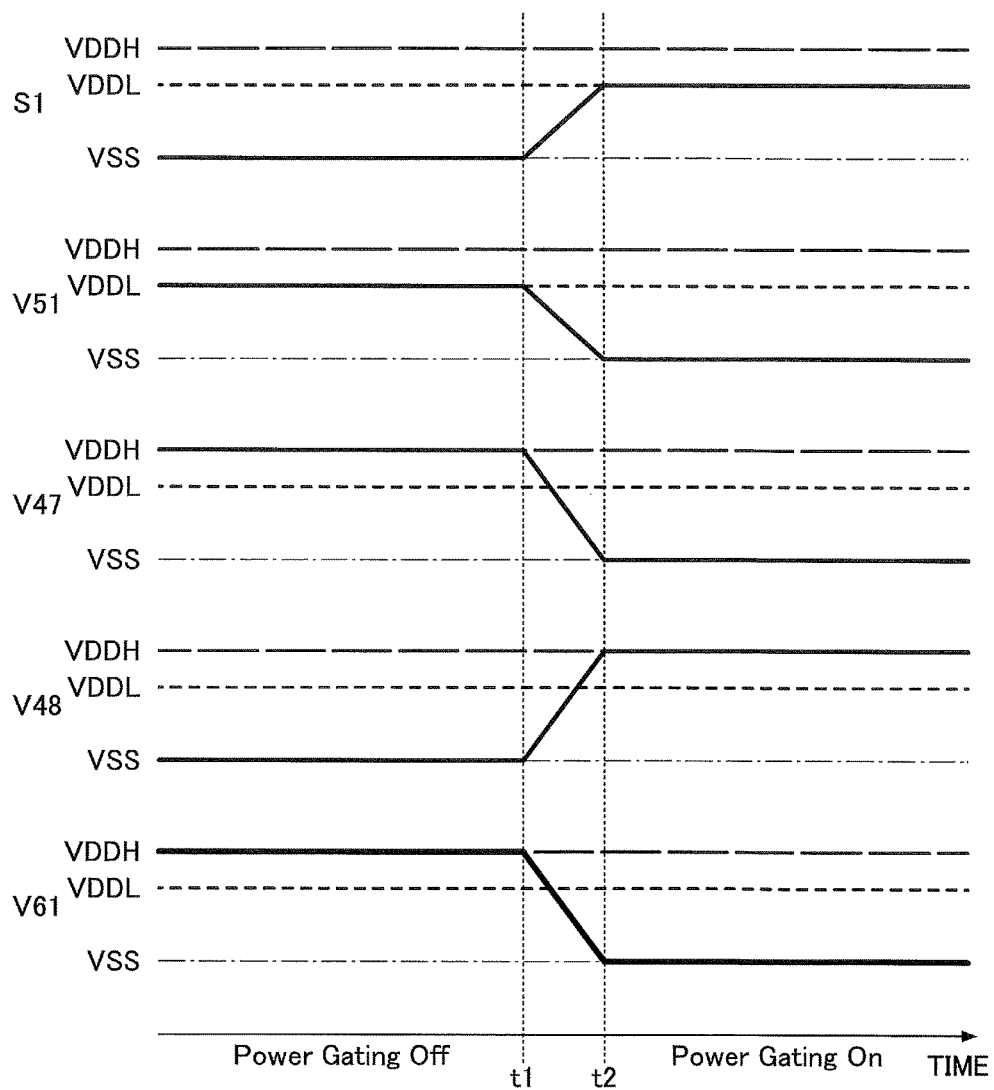
FIG. 2 is a timing chart of an operation of the semiconductor device.

FIG. 2 is a timing chart indicating an operation of the semiconductor device 101. A description of FIG. 2 is given with reference to FIG. 1.

When the voltage level of the control signal S1 is at the ground voltage VSS, which is a low level, the voltage V51 of the circuit node 51 is equal to the power supply voltage VDDL because the PMOS transistor 10 is turned on. Additionally, when the voltage level of the control signal S1 is at the ground voltage VSS, which is a low level, the voltage V47 of the output node 47 is equal to the power supply voltage VDDH because the PMOS transistor 43 is turned on and the NMOS transistor 44 is turned off. When the voltage V47 is equal to the power supply voltage VDDH, the voltage V48 of the output node 48 is equal to the ground voltage VSS because the PMOS transistor 45 is turned off and the NMOS transistor 46 is turned on. When the voltage V48 is at the ground voltage VSS, the voltage V61 of the circuit node 61 is equal to the power supply voltage VDDH because the PMOS transistor 20 is turned on.

That is, the power gating function is deactivated during a time period until a timing t1 at which the voltage level of the control signal S1 is at the ground voltage VSS, which is a low level, because a power is supplied to either of the circuit node 51 and the circuit node 61

On the other hand, when the voltage level of the control signal is at the power supply voltage VDDL, which is a high level, the voltage V51 of the circuit node 51 is equal to the ground voltage VSS because the PMOS transistor 10 is turned off. Although the leak current I1 of the PMOS transistor 10 and the leak current I2 of the circuit block 50 are balanced according to the operation of the PMOS transistor 10, the conductance of the PMOS transistor 10 is smaller than the conductance of the circuit block 50. Thus, the voltage between the source and drain of the PMOS transistor 10 approximates the power supply voltage VDDL, and the voltage between opposite terminals of the circuit block 50 approximates the ground voltage VSS. Thereby, the voltage V51 of the circuit node 51 becomes nearly equal to the ground voltage VSS.

Additionally, when the voltage level of the control signal S1 is at the power supply voltage VDDL, which is a high level, the voltage V47 of the output node 47 is equal to the ground voltage VSS because the PMOS transistor 43 is turned off and the NMOS transistor 44 is turned on. When the voltage V47 is at the ground voltage VSS, the voltage V48 of the output node 48 is equal to the power supply voltage VDDH because the PMOS transistor 45 is turned on and the NMOS transistor 46 is turned off. When the voltage V48 is at the power supply voltage VDDH, the voltage V61 of the circuit node 61 is equal to the ground voltage VSS for the same reason as the voltage 51 mentioned above.

That is, the power gating function is activated during a time period after a timing t2 at which the voltage level of the control signal S1 is at the power supply voltage VDDL, which is a high level, because a power is supplied neither of the circuit node 51 and the circuit node 61.

Figure 3A:
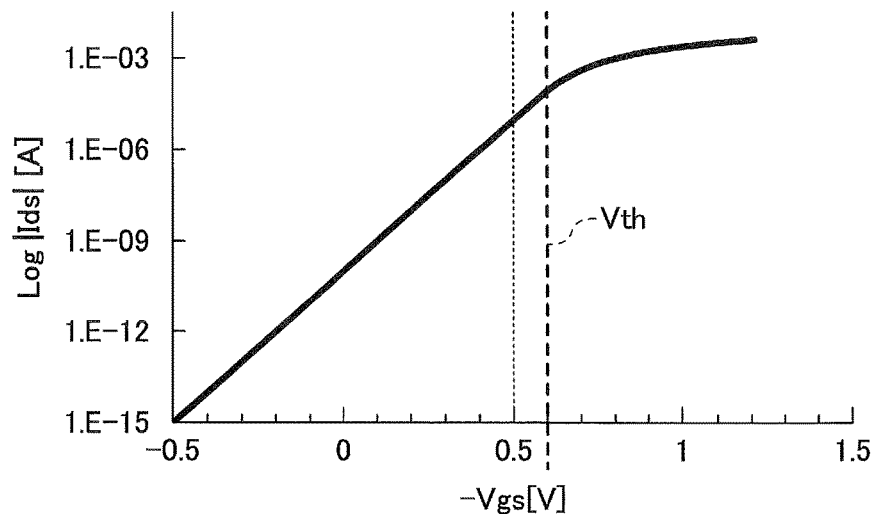
FIGS. 3A and 3B are graphs indicating characteristics of transistors.
Figure 3B:
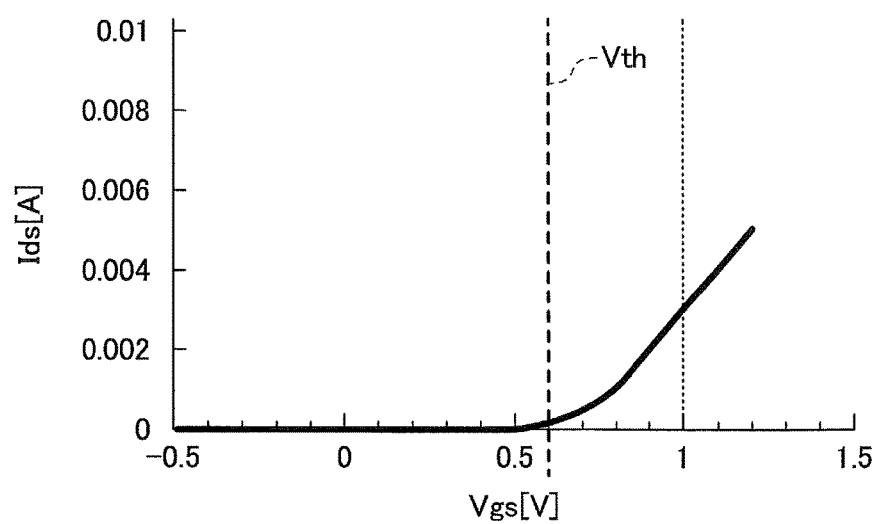

FIGS. 3A and 3B are graphs indicating characteristics of both the PMOS and NMOS transistors that are used in the semiconductor device 101. FIG. 3A indicates a characteristic of the PMOS transistor when the PMOS transistor turns off. FIG. 3B indicates a characteristic of the NMOS transistor when the NMOS transistor turns on. In FIGS. 3A and 3B, Vth represents a gate threshold voltage of each transistor, Vgs represents a voltage applied between the gate and source of each transistor, Ids represents a current flowing between the drain and source of each transistor, Log represents a common logarithm, and 1.E-n (n is a positive integer) represents $1.0 \times 10^{-n}$. Note that the specific numerical values in the figures are indicated for the sake of convenience to make an easier explanation of the tuning on/off operation of the transistors.

When the voltage level of the control signal S1 is at the power supply voltage VDDL, which is a high level, the PMOS transistor 43 is turned off (refer to FIG. 3A) because the voltage Vgs of the PMOS transistor 43 of the CMOS inverter 41 is at a voltage (VDDL-VDDH), which is lower than the gate threshold voltage Vth. On the other hand, when the voltage level of the control signal S1 is at the power supply voltage VDDL, which is a high level, the NMOS transistor 44 is turned on (refer to FIG. 3B) because the voltage Vgs of the NMOS transistor 44 of the CMOS inverter 41 is at a voltage (VDDL-VSS), which is higher than the gate threshold voltage Vth.

However, the voltage Vgs of the PMOS transistor 43 is at the voltage (VDDL-VDDH), which is lower than the gate threshold voltage Vth but not zero. Thus, an amount of leak of the current Ids of the PMOS transistor 43 is larger than when the voltage Vgs is zero.

Thus, the absolute value of the gate threshold voltage Vth of the PMOS transistor 43 is set higher than the gate threshold voltage Vth of the NMOS transistor 44. Accordingly, the characteristic of the PMOS transistor 43, when the PMOS transistor 43 is turned off, changes as indicated in FIG. 4.

Figure 4:
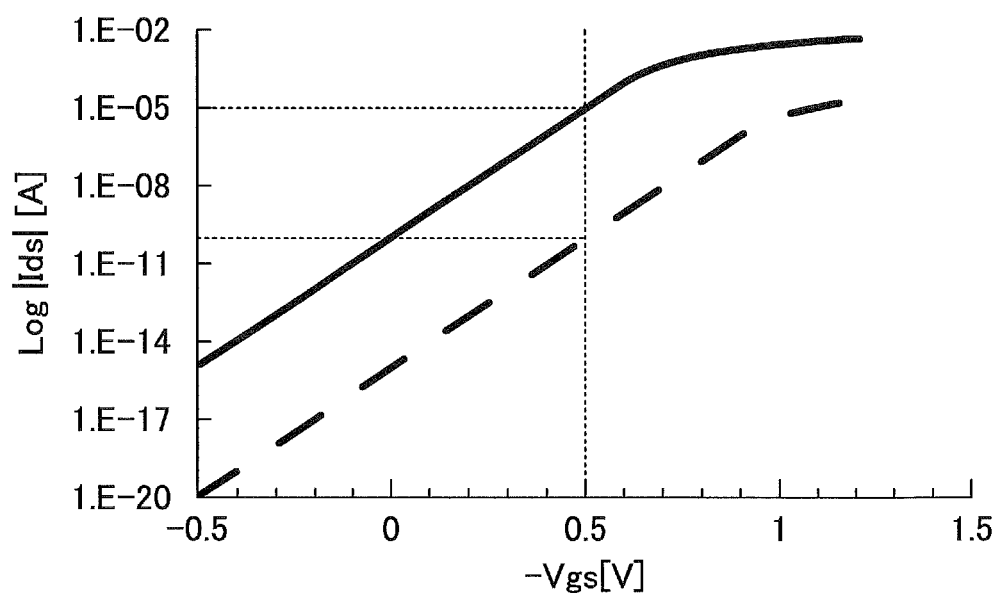
FIG. 4 is a graph indicating characteristic of a transistor.

In FIG. 4, a bold solid line indicates a case where the absolute value of the gate threshold voltage Vth of the PMOS transistor 43 and the absolute value of the gate threshold voltage Vth of the NMOS transistor 44 are the same voltage value (for example, 0.6 V). A bold dashed line indicates a case where the absolute value of the gate threshold voltage Vth of the PMOS transistor 43 is higher than the absolute value of the gate threshold voltage Vth of the NMOS transistor 44 (for example, a case where the absolute value of the gate threshold voltage Vth of the PMOS transistor 43 is 0.9 V and the absolute value of the gate threshold voltage Vth of the NMOS transistor 44 is 0.6 V).

As mentioned above, even if the voltage Vgs of the PMOS transistor 43 is the same, the amount of leak of the current Ids of the PMOS transistor 43 can be reduced by setting the absolute value of the gate threshold voltage Vth of the PMOS transistor 43 lower than the gate threshold voltage Vth of the NMOS transistor 44. As a result, the semiconductor device 100 can be a low-power consumption type.

Figure 5A:
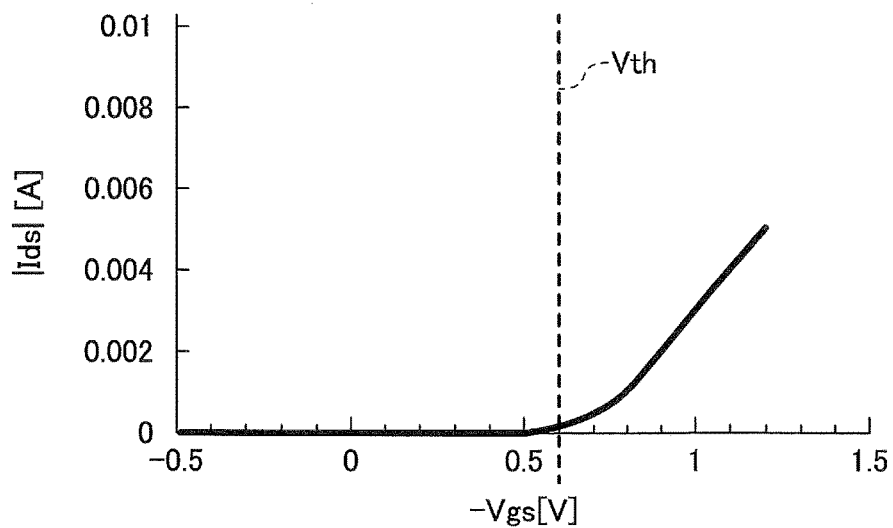
FIGS. 5A and 5B are graphs indicating characteristics of transistors.
Figure 5B:
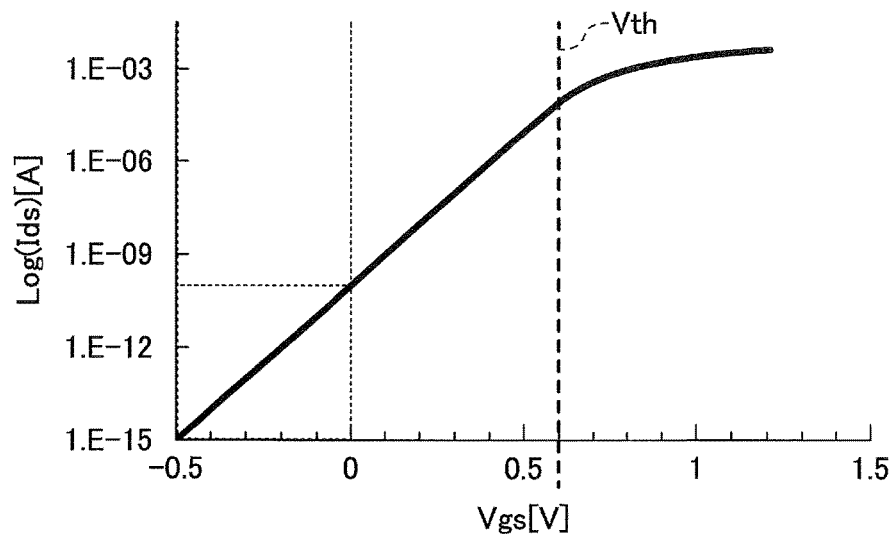

FIGS. 5A and 5B are graphs indicating characteristics of both the PMOS and NMOS transistors that are used in the semiconductor device 101. FIG. 5A indicates a characteristic of the PMOS transistor when the PMOS transistor turns on. FIG. 5B indicates a characteristic of the NMOS transistor when the NMOS transistor turns off. In FIGS. 5A and 5B, Vth represents a gate threshold voltage of each transistor, Vgs represents a voltage applied between the gate and source of each transistor, Ids represents a current flowing between the drain and source of each transistor, Log represents a common logarithm, and 1.E-n (n is a positive integer) represents $1.0 \times 10^{-n}$. Note that the specific numerical values in the figures are indicated for the sake of convenience to make an easier explanation of the tuning on/off operation of the transistors.

When the voltage level of the control signal S1 is at the ground voltage VSS, which is a low level, the PMOS transistor 43 is turned on (refer to FIG. 5A) because the voltage Vgs of the PMOS transistor 43 of the CMOS inverter 41 is at a voltage (VSS-VDDH), which is higher than the gate threshold voltage Vth. On the other hand, when the voltage level of the control signal S1 is at the ground voltage VSS, which is a low level, the NMOS transistor 44 is turned off (refer to FIG. 5B) because the voltage Vgs of the NMOS transistor 44 of the CMOS inverter 41 is at a voltage (VSS-VDDL), which is lower than the gate threshold voltage Vth. Thus, because the voltage Vgs of the NMOS transistor 44, when the power gating function is deactivated, can be a negative voltage, the amount of leak of the current Ids of the NMOS transistor 44 can be reduced as indicated in FIG. 5B as compared to a case where the voltage Vgs is, for example, zero. As the semiconductor device 101 can be a low-power consumption type.

Figure 6:
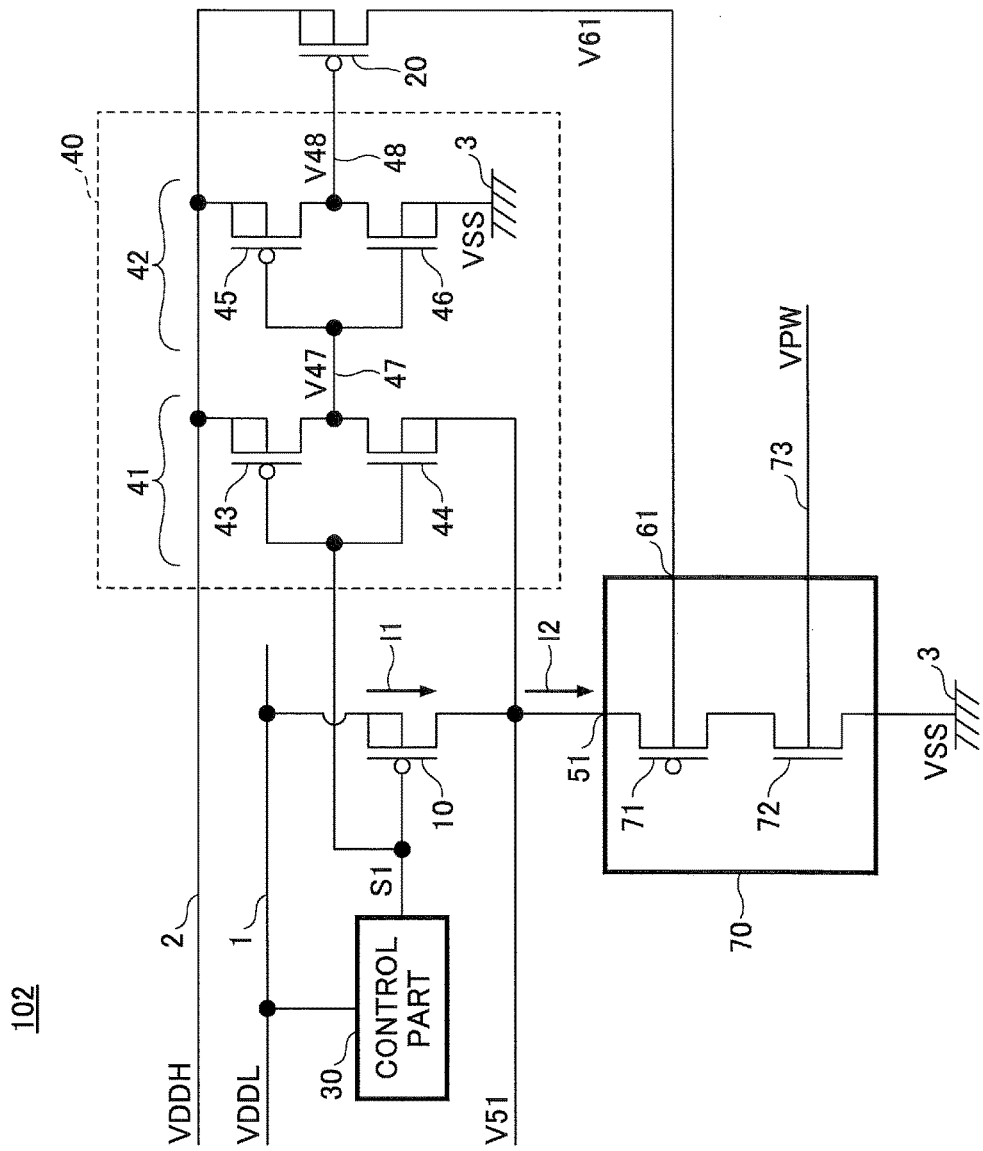
FIG. 6 is a circuit diagram of a semiconductor device according to a variation.

FIG. 6 is a circuit diagram a semiconductor device 102 according to a variation. In FIG. 6, parts that are the same as the parts illustrated in FIG. 1 are given the same reference numerals, and descriptions thereof will be omitted. Additionally, descriptions of the structure and effect of the semiconductor device 102 that are the same as that of the semiconductor device 101 will be omitted. The circuit nodes 51 and 61 illustrated in FIG. 1 correspond to circuit nodes of a circuit block 70 illustrated in FIG. 6.

The semiconductor device 102 includes the circuit block 70 that is connected between the circuit node 51 and the ground node 3. The circuit block 70 is an example of a combination circuit having the PMOS transistor 71 and the NMOS transistor 72. The NMOS transistor 72 has a back gate 73 to which a power supply voltage VPW for a P-well formed on the substrate of the semiconductor device 102 is input. The PMOS transistor 71 has a back gate to which a power supply voltage V61 for an N-well formed on the substrate of the semiconductor device 102 is input. The circuit node 51 is connected to a source of the PMOS transistor 71, and the circuit node 61 is connected to the back gate of the PMOS transistor 71.

When the voltage level of the control signal S1 is at the power supply voltage VDDL, which is a high level, the voltage V51 of the circuit node 51 is nearly equal to the ground voltage VSS by the PMOS transistor 10 being turned off. Thus, an amount of junction leak between the back gate of the PMOS transistor 71 and the ground node 3 is increased. However, in such a case, the increase in the amount of junction leak can be suppressed because the PMOS transistor 20 is also turned off.

Figure 7:
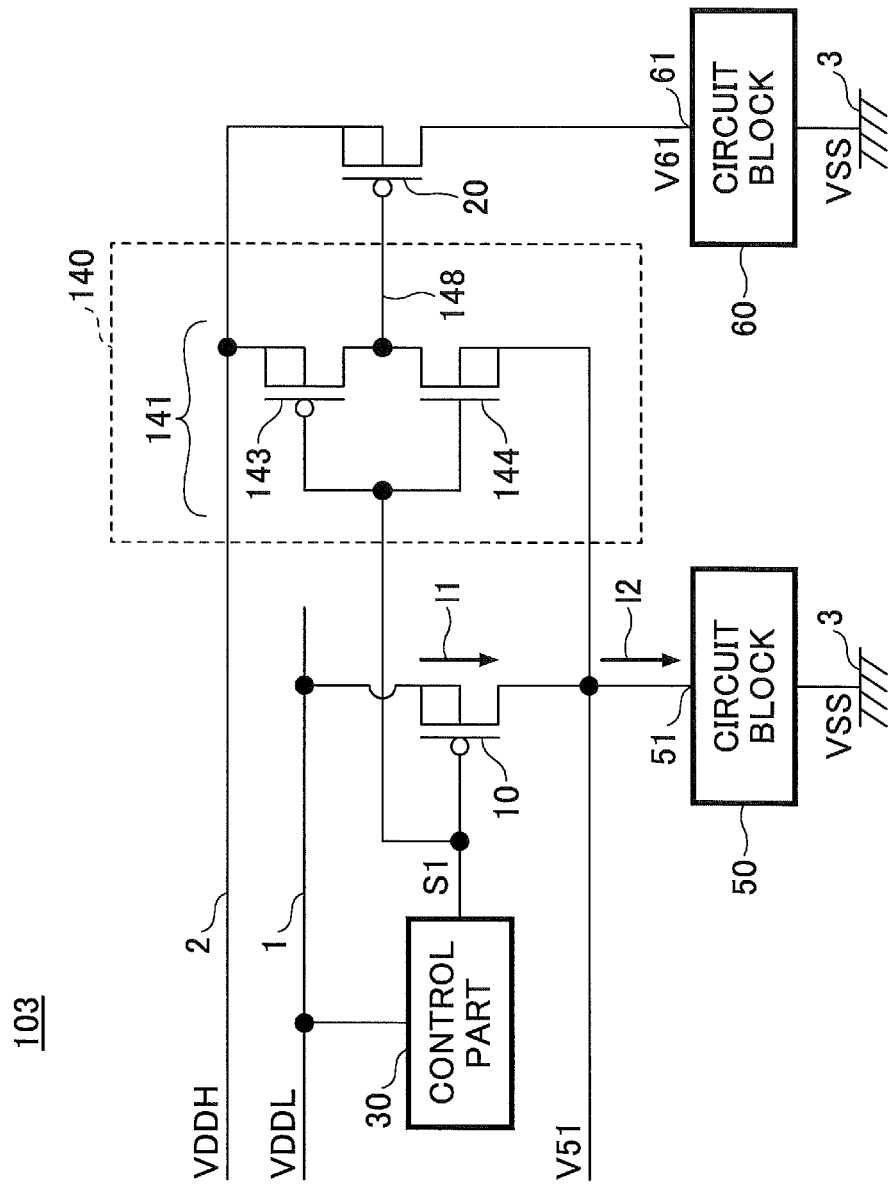
FIG. 7 is a circuit diagram of a semiconductor device according to another variation.

FIG. 7 is a circuit diagram of a semiconductor device 103 according to another variation. In FIG. 7, parts that are the same as the parts illustrated in FIGS. 1 and 6 are given the same reference numerals, and descriptions thereof will be omitted. Additionally, descriptions of the structure and effect of the semiconductor device 103 that are the same as the semiconductor devices 101 and 102 will be omitted. The semiconductor device 103 illustrated in FIG. 7 has a driver 140 having a structure different from the driver 40 illustrated in FIG. 1.

The driver 140 is an example of a driver that drives a second switch by a third switch, which is connected between a second power supply node and a first circuit node, being driven. For example, the driver 140 is a circuit to drive the PMOS transistor 20 by the CMOS inverter 141, which is connected between the power supply node 2 and the circuit node 51, being driven. The CMOS inverter 141 is an example of the third switch.

The driver 140 includes the CMOS inverter 141 to which the control signal S1 is input. The CMOS inverter 141 includes the NMOS transistor 144 and the PMOS transistor 143 that are connected in series. The NMOS transistor 144 has a gate to which the control signal is input, a source and back gate connected the circuit node 51 and a drain connected to the output node 148 of the driver 140. The PMOS transistor 143 has a gate to which the control signal is input, a source and back gate connected to the power supply node 2 and a drain connected to the output node 148. The output node 148 is connected to the gate of the PMOS transistor 20.

According to the semiconductor device 103, PMOS transistor 20 is turned off when the PMOS transistor 10 is turned on, and the PMOS transistor 20 is turned on when the PMOS transistor 10 is turned off. Accordingly, a time period during which a power supplied to the circuit node 51 is interrupted and a time period during which a power supplied to the circuit node 61 is interrupted are made alternately different from each other.

Figure 8:
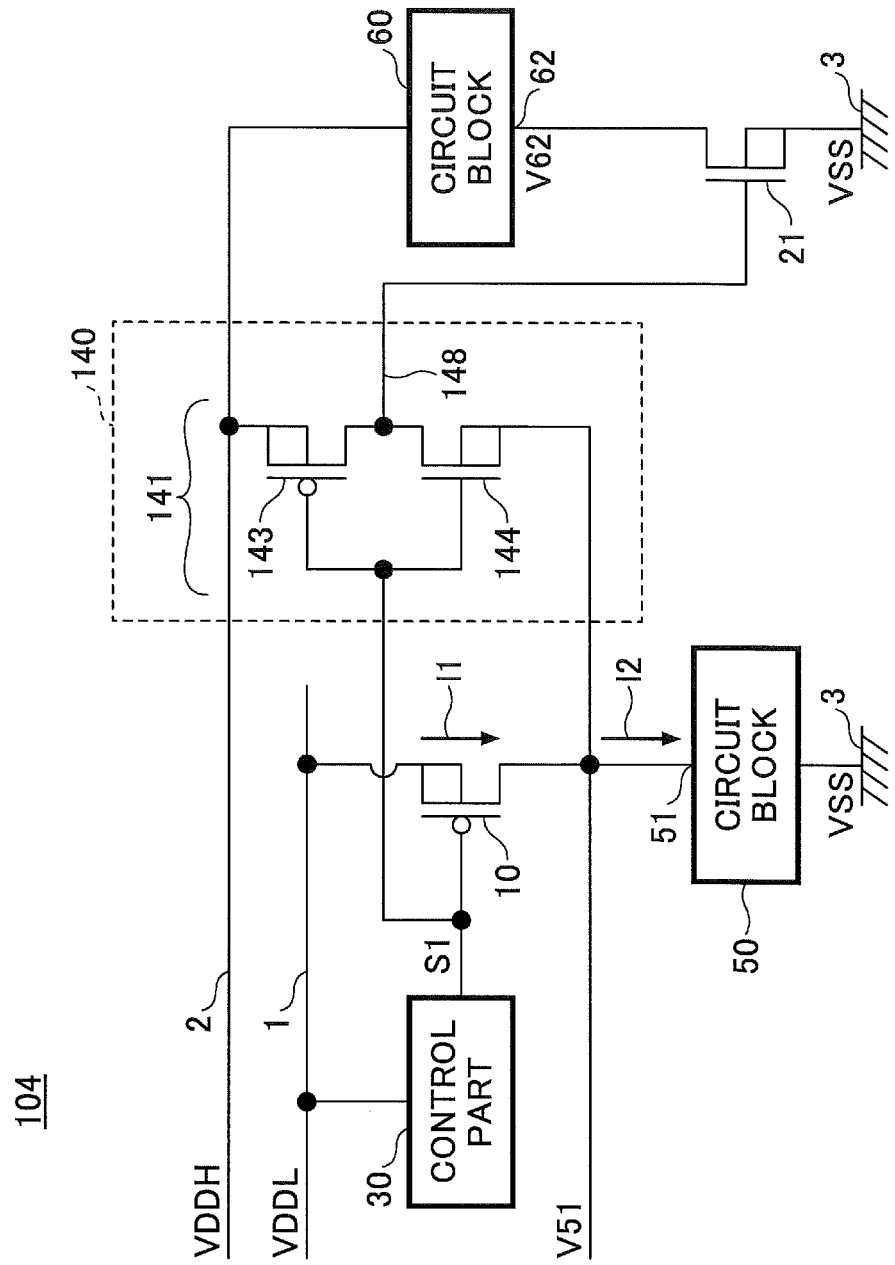
FIG. 8 is a circuit diagram of a semiconductor device according to a further variation.

FIG. 8 is a circuit diagram of a semiconductor device 104 according to another variation. In FIG. 8, parts that are the same as the parts illustrated in FIGS. 1, 6 and 7 are given the same reference numerals, and descriptions thereof will be omitted. Additionally, descriptions of the structure and effect of the semiconductor device 104 that are the same as the semiconductor devices 101, 102 and 103 will be omitted.

The semiconductor device 104 illustrated in FIG. 8 includes an NMOS transistor 21 as an example of a second switch that is capable of interrupting a power supplied from the second power supply node to the second circuit node. The NMOS transistor 21 is a semiconductor switching element that is capable of interrupting a power supplied from the power supply node 2 to a circuit node 62 of the circuit block 60. The NMOS transistor 21 has a gate connected to the output node 148, a source and back gate connected to the ground node 3 and a drain connected to the circuit node 62. The circuit node 62 is a node to which a power to be supplied to the predetermined circuit block 60 is output.

According to the semiconductor device 104, the NMOS transistor 21 is turned on when the PMOS transistor 10 is turned on, and the NMOS transistor 21 is turned off when the PMOS transistor 10 is turned off. When the NMOS transistor 21 is turned on, the voltage V62 of the circuit block 62 is nearly equal to the ground voltage VSS, thereby enabling the power supply from the power supply node 2 to the circuit block 60 and the circuit node 62. When the NMOS transistor 21 is turned off, the voltage V62 of the circuit node 62 is nearly equal to the power supply voltage VDDH, thereby interrupting a power supplied from the power supply node 2 to the circuit block 60 and the circuit block 62. Accordingly, similar to the semiconductor device 101, an interruption of the power supplied to the circuit node 51 and an interruption of the power supplied to the circuit node 61 can be performed simultaneously.

Figure 9:
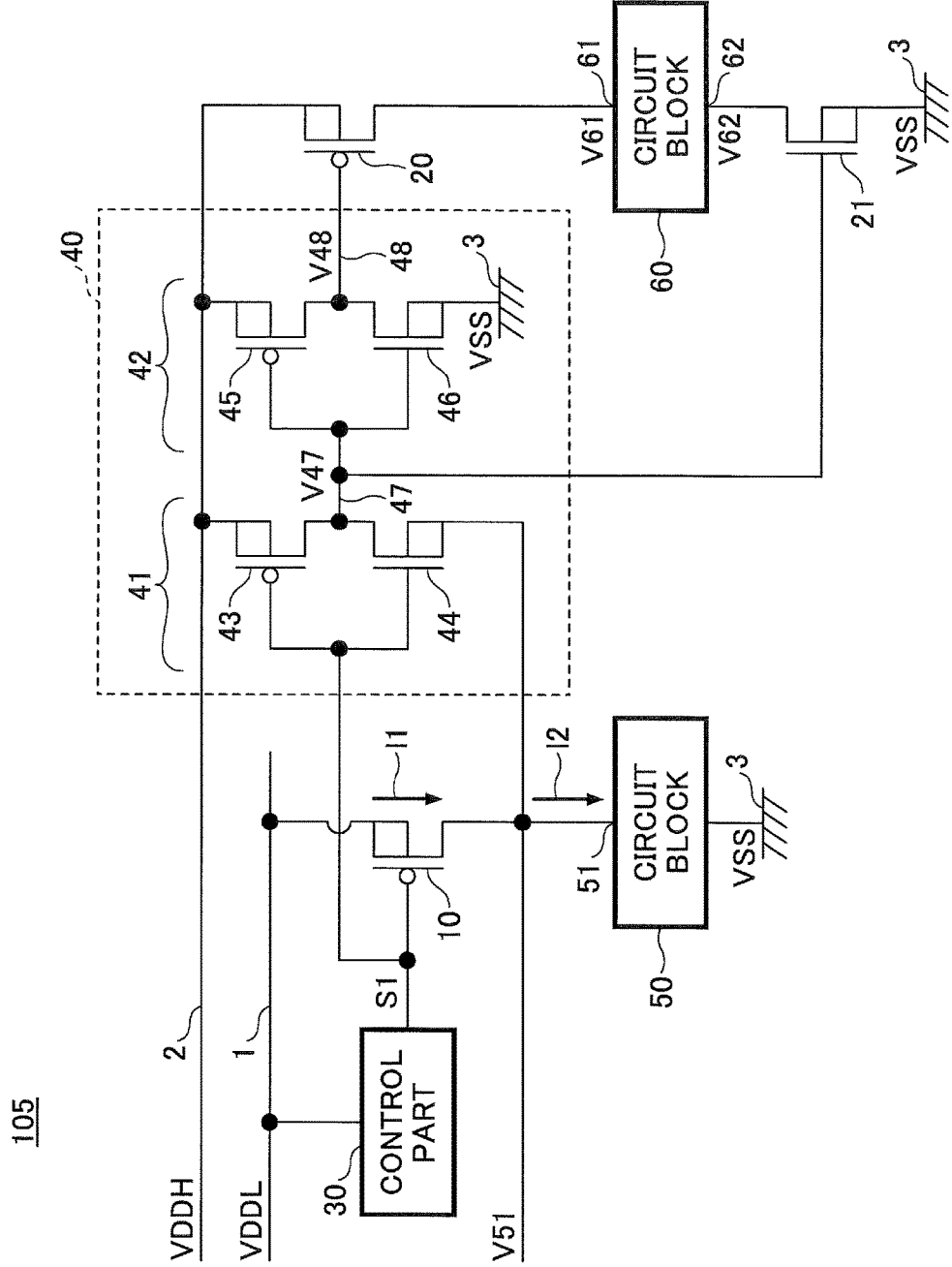
FIG. 9 is a circuit diagram of a semiconductor device according to another variation.

FIG. 9 is a circuit diagram of a semiconductor device 105 according to another variation. In FIG. 9, parts that are the same as the parts illustrated in FIGS. 1 and 6-8 are given the same reference numerals, and descriptions thereof will be omitted. Additionally, descriptions of the structure and effect of the semiconductor device 105 that are the same as the semiconductor devices 101 through 104 will be omitted.

The driver 40 drives the NMOS transistor 21 and the PMOS transistor 20 by the CMOS inverter 41 being driven. The NMOS transistor 21 is turned on/off by the drive of the CMOS inverter 41, and the PMOS transistor 20 is turned on/off by the drive of the CMOS inverter 42. The output node 47 is connected to the gate of the NMOS transistor 21, and the output node 48 is connected to the gate of the PMOS transistor 20.

According to the semiconductor device 105, the PMOS transistor 20 and the NMOS transistor 21 are turned on when the PMOS transistor 10 is turned on, and the PMOS transistor 20 and the NMOS transistor 21 are turned off when the PMOS transistor 10 is turned off. Accordingly, similar to the semiconductor device 101, an interruption of the power supplied to the circuit node 51 and an interruption of the power supplied to the circuit nodes 61 and 62 can be performed simultaneously.

Figure 10:
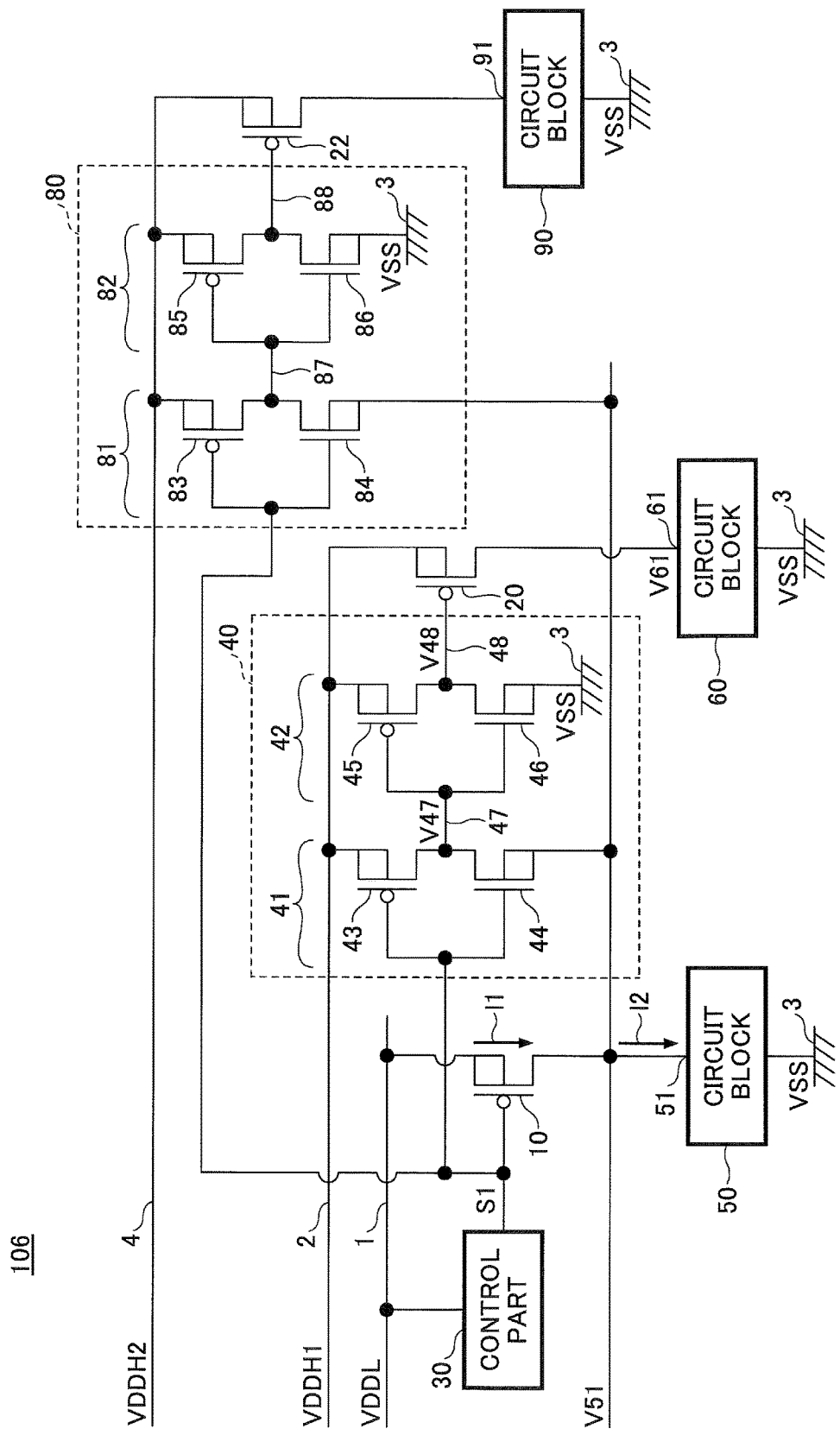
FIG. 10 is a circuit diagram of a semiconductor device according to another variation.

FIG. 10 is a circuit diagram of a semiconductor device 106 according to another variation. In FIG. 10, parts that are the same as the parts illustrated in FIGS. 1 and 6-9 are given the same reference numerals, and descriptions thereof will be omitted. Additionally, descriptions of the structure and effect of the semiconductor device 106 that are the same as the semiconductor devices 101 through 105 will be omitted. The semiconductor device 106 illustrated in FIG. 10 includes a power supply node 4, a PMOS transistor 22, a driver 80 and a circuit node 91.

The power supply node 4 is an example of a third power supply node having a voltage value higher than the second power supply node. The power supply node 4 is a third high power supply potential part that is capable of supplying a DC power of a power supply voltage VDDH2 higher than a power supply voltage VDDH1 of the power supply node 2. The voltage values of the power supply voltages VDDH1 and VDDH2 may be equal to each other.

The PMOS transistor 22 is an example of a fifth switch that interrupts a power supplied from the third power supply node to the circuit node 91. The PMOS transistor 22 is a semiconductor switching device that is capable of interrupting a power supplied from the power supply node 4 to the circuit node 91.

The circuit node 91 is an example of a third circuit node to which a power supplied to a predetermined circuit block 20 is input. The circuit block 90 is an arbitrary circuit connected between the circuit node 91 and the ground node 3. The circuit block 90 is constituted by a single or a plurality of elements.

The driver 80 is an example of a second driver that drives the fifth switch by a sixth switch being driven. The sixth switch is connected between the third power supply node and the first circuit node. The driver 80 is, for example, a circuit to drive the PMOS transistor 22 by a CMOS inverter 81 being driven. The CMOS inverter 81 is connected between the power supply node 4 and the circuit node 51.

The driver 80 includes a CMOS inverter 81 to which the control signal S1 is input and a CMOS inverter 82 to which an output of the inverter 81 is input. The control signal S1 is a signal common to the PMOS transistor 10, CMOS inverter 41 and CMOS inverter 81.

The driver 80 has the same structure as the driver 40. For example, the CMOS inverter 81 includes an NMOS transistor 84 and a PMOS transistor 83 having an absolute value of a gate threshold voltage higher than a gate threshold voltage of the NMOS transistor 84. Thereby, an amount of leak of the current Ids of the PMOS transistor 83 can be reduced. The driver 80 includes a CMOS inverter 82 between the power supply node 4 and the ground node 3.

The CMOS inverter 82 is an example of a seventh switch that drives the PMOS transistor 22. A gate of the PMOS transistor 22 is connected to an output node 88 of the CMOS inverter 82 of the driver 80.

Therefore, even if the number of power supply nodes having different voltage values is increased to two or more than three, a control of a power gating with respect to each power supply node can be controlled while reducing the number of pieces of the control part 30.

All examples and conditional language recited herein are intended for pedagogical purposes to aid the reader in understanding the principles of the invention and the concepts contributed by the inventor to furthering the art, and are to be construed a being without limitation to such specifically recited examples and conditions, nor does the organization of such examples in the specification relates to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device, comprising:
a first power supply node;
a second power supply node having a voltage value higher than a voltage value of the first power supply node;
a first switch that interrupts a power supplied from the first power supply node to a first circuit node;
a second switch that interrupts a power supplied from the second power supply node to a second circuit node;
a driver that drives the second switch by a third switch being driven, the third switch being connected directly between the second power supply node and the first circuit node; and
a controller that outputs a control signal to drive the first and third switches.

2. The semiconductor device as claimed in claim 1, wherein the third switch is a CMOS inverter.

3. The semiconductor device as claimed in claim 2, wherein the CMOS inverter includes an NMOS transistor and a PMOS transistor having an absolute value of a gate threshold voltage higher than a gate threshold voltage of the NMOS transistor.

4. The semiconductor device as claimed in claim 3, wherein the driver includes a fourth switch that drives the second switch, the fourth switch located between the second power supply node and a ground node.

5. The semiconductor device as claimed in claim 4, wherein the fourth switch is a CMOS inverter.

6. The semiconductor device as claimed in claim 5, wherein the second switch includes an NMOS transistor that is driven by the third switch and a PMOS transistor that is driven by the fourth switch.

7. The semiconductor device as claimed in claim 1, wherein the second switch is a PMOS transistor.

8. The semiconductor device as claimed in claim 1, wherein the second switch is an NMOS transistor.

9. The semiconductor device as claimed in claim 1, wherein the controller is supplied with a power from the first power supply node.

10. A semiconductor device, comprising:
a first power supply node;
a second power supply node having a voltage value higher than a voltage value of the first power supply node;
a first switch that interrupts a power supplied from the first power supply node to a first circuit node;
a second switch that interrupts a power supplied from the second power supply node to a second circuit node;
a driver that drives the second switch by a third switch being driven, the third switch being connected between the second power supply node and the first circuit node; and
a controller that outputs a control signal to drive the first and third switches, wherein
the first and second circuit nodes are included in a first circuit block;
the first circuit node is connected to a source of a PMOS transistor included in the first circuit block; and
the second circuit node is connected to a back gate of the PMOS transistor included in the first circuit block.

11. A semiconductor device, comprising:
a first power supply node;
a second power supply node having a voltage value higher than a voltage value of the first power supply node;
a first switch that interrupts a power supplied from the first power supply node to a first circuit node;
a second switch that interrupts a power supplied from the second power supply node to a second circuit node;
a driver that drives the second switch by a third switch being driven, the third switch being connected between the second power supply node and the first circuit node; and
a controller that outputs a control signal to drive the first and third switches;
a third power supply node having a voltage value higher than a voltage value of the second power supply node;
a fifth switch that interrupts a power supplied from the third power supply node to a third circuit node; and
a second driver that drives the fifth switch by a sixth switch being driven, the sixth switch connected between the third power supply node and the first circuit node,
wherein the control signal is common to the first, third and sixth switches.

12. The semiconductor device as claimed in claim 11, wherein the sixth switch is a CMOS inverter.

13. The semiconductor device as claimed in claim 12, wherein the CMOS inverter includes an NMOS transistor and a PMOS transistor having an absolute value of a gate threshold voltage higher than a gate threshold voltage of the NMOS transistor.

14. The semiconductor device as claimed in claim 13, wherein the second driver includes a seventh switch that drives the fifth switch, the seventh switch located between the third power supply node and a ground node.

15. The semiconductor device as claimed in claim 14, wherein the seventh switch is a CMOS inverter.

* * * * *